United States Patent
Ryu et al.

(10) Patent No.: US 6,229,748 B1
(45) Date of Patent: May 8, 2001

(54) MEMORY DEVICE USING ONE COMMON BUS LINE BETWEEN ADDRESS BUFFER AND ROW PREDECODER

(75) Inventors: Je-Hun Ryu; Jong-Hee Han, both of Ichon-shi (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/474,992

(22) Filed: Dec. 30, 1999

(30) Foreign Application Priority Data

Dec. 30, 1998 (KR) .................................. 98-61112

(51) Int. Cl.$^7$ ....................................... G11C 7/00

(52) U.S. Cl. ............................. 365/222; 365/191

(58) Field of Search .................... 365/222, 191

(56) References Cited

U.S. PATENT DOCUMENTS 4,580,216 * 4/1986 Bellay et al. ..................... 364/200

* cited by examiner

*Primary Examiner*—David Nelms
*Assistant Examiner*—M. Tran
(74) *Attorney, Agent, or Firm*—Blakely Sokoloff Taylor & Zafman

(57) ABSTRACT

Disclosed is a semiconductor memory device to reduce the number of address bus lines. The semiconductor memory device according to the present invention includes a common data bus line, a plurality of address buffers coupled to the common data bus line for buffering external address signals, a refresh counter coupled to the common data bus line, including a buffer for providing refresh address signals, a first controller for selectively transferring the external address signals buffered in the address buffers to the common data bus line, and a second controller for selectively transferring the refresh address signals from the refresh counter to the common data bus line.

8 Claims, 6 Drawing Sheets

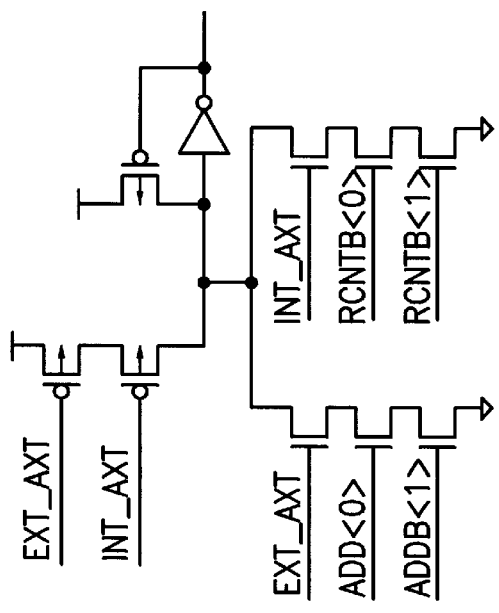
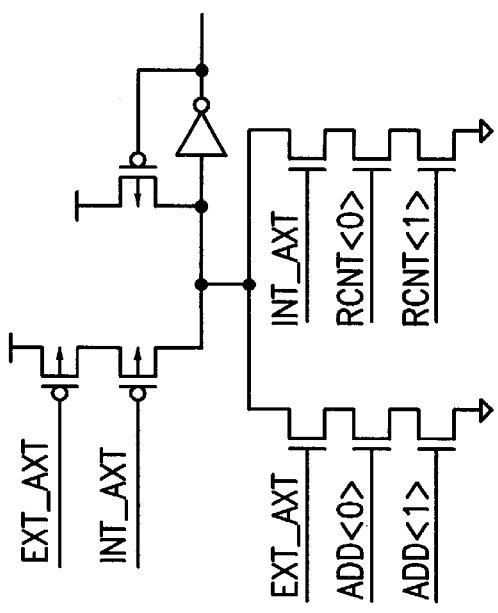
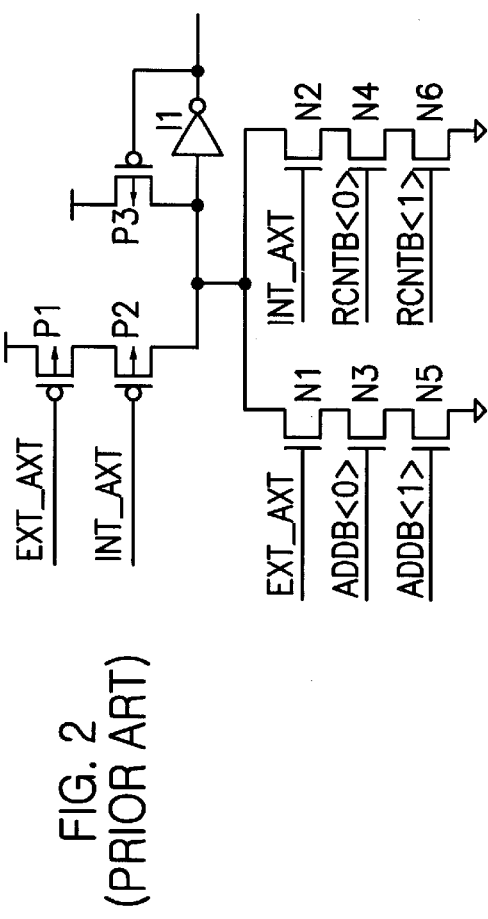
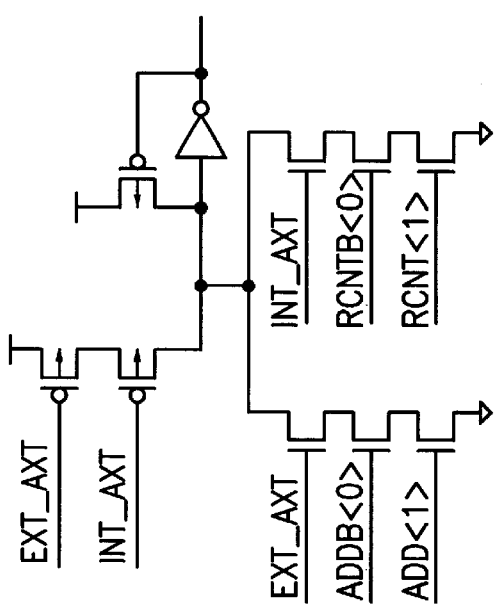
FIG. 2
(PRIOR ART)

MEMORY DEVICE USING ONE COMMON BUS LINE BETWEEN ADDRESS BUFFER AND ROW PREDECODER

FIELD OF THE INVENTION

The present invention relates to a semiconductor memory device, and more particularly, to a semiconductor memory device to reduce the number of address bus lines.

DESCRIPTION OF THE PRIOR ARTS

Generally, row address signals, which are input from an external circuit in order to select a word line, are first buffered in an address buffer to remove noises and to amplify signal level. Also, before being input into a row decoder, the row address signals are input into a row predecoder to select a word line.

FIG. 1 is a schematic diagram illustrating a conventional memory device having row address bus lines. In FIG. 1, the reference numeral 1 denotes an address buffer block, 2 a refresh counter, 3 a row predecoder, 4 a row decoder and 5 a memory array block, respectively. As shown in FIG. 1, the conventional memory device having the address buffer block 1 has two output terminals ADD and ADDB which are out of phase. The memory device receives the row address signals, selects a specific word line and performs write and read operations in each cell of the memory array block 5. At this time, the memory device processing addresses signals A0 to An requires n+1 address buffers and each address buffers are in need of two bus lines ADD and ADDB so that total numbers of the address bus lines to be required therein are 2 (n+1). Further, in a refresh mode, the refresh counter 2 to refresh the memory cells requires 2(n+1) bus lines.

The row predecoder 3 having 4-bit output data is shown in FIG. 2. As shown in FIG. 2, the conventional row predecoder 3 requires 4 input lines including two input lines (address line (ADD) and address bar line (ADDB)) from the address buffers and further two input lines (refresh line (RCNT) and refresh bar line (RCNTB)). Furthermore, the conventional row predecoder 3 requires control lines to control external and internal address signals, i.e., external address catch signal EXT_AXT and internal (refresh) address catch signal INT_AXT and also requires many transistors connected to these lines.

As described above, since the conventional memory device requires two data lines per row address buffer, there are many problems in increasing the integration thereof. Particularly, since each address buffer is connected to two bus lines, the memory device may occupy the large chip area.

SUMMARY OF THE INVENTION

It is, therefore, an object of the present invention to provide a highly integrated semiconductor memory device by reducing the number of bus lines of address buffers.

It is another object of the present invention to provide a highly integrated semiconductor memory device by reducing the number of transistors in a predecoder with the reduction of the number of bus lines of address buffers.

In accordance with an aspect of the present invention, there is provided a memory device comprising: a common data bus line; a plurality of address buffers coupled to the common data bus line for buffering external address signals; a refresh counter coupled to the common data bus line, including a buffer for providing refresh address signals; a first control means for selectively transferring the external address signals buffered in the address buffers to the common data bus line; and a second control means for selectively transferring the refresh address signals from the refresh counter to the common data bus line.

In accordance with another aspect of the present invention, there is provided a memory device comprising: a common data bus line; a plurality of address buffers and a plurality of a refresh counting buffers, wherein the address buffers receive external address signals and the refresh counting buffers receive refresh address signals and wherein the address buffers and the refresh counting buffers are coupled to the common data bus line; a first control means for selectively transferring address signals buffered in the address buffers to the common data bus line; a second control means for selectively transferring the refresh address signals buffered in the refresh counting buffer to the common data bus line; and a predecoder coupled to the common data bus line, wherein the predecoder includes four transistors receiving a predecoder catch signal and external or refresh address signals.

BRIEF DESCRIPTION OF THE DRAWINGS

The accompanying drawings, which are included to provide a further understanding of the present invention and are incorporated in and constitute a part of this specification, illustrate embodiments of the present invention and together with the description serve to explain the concept the present invention, wherein:

FIG. 2 is a circuit diagram illustrating a conventional row predecoder in FIG. 1;

DETAILED DESCRIPTION OF THE PREFERRED EMBODIMENTS

Hereinafter, the present invention will be described in detail, referring to the accompanying drawings.

Figure 1:
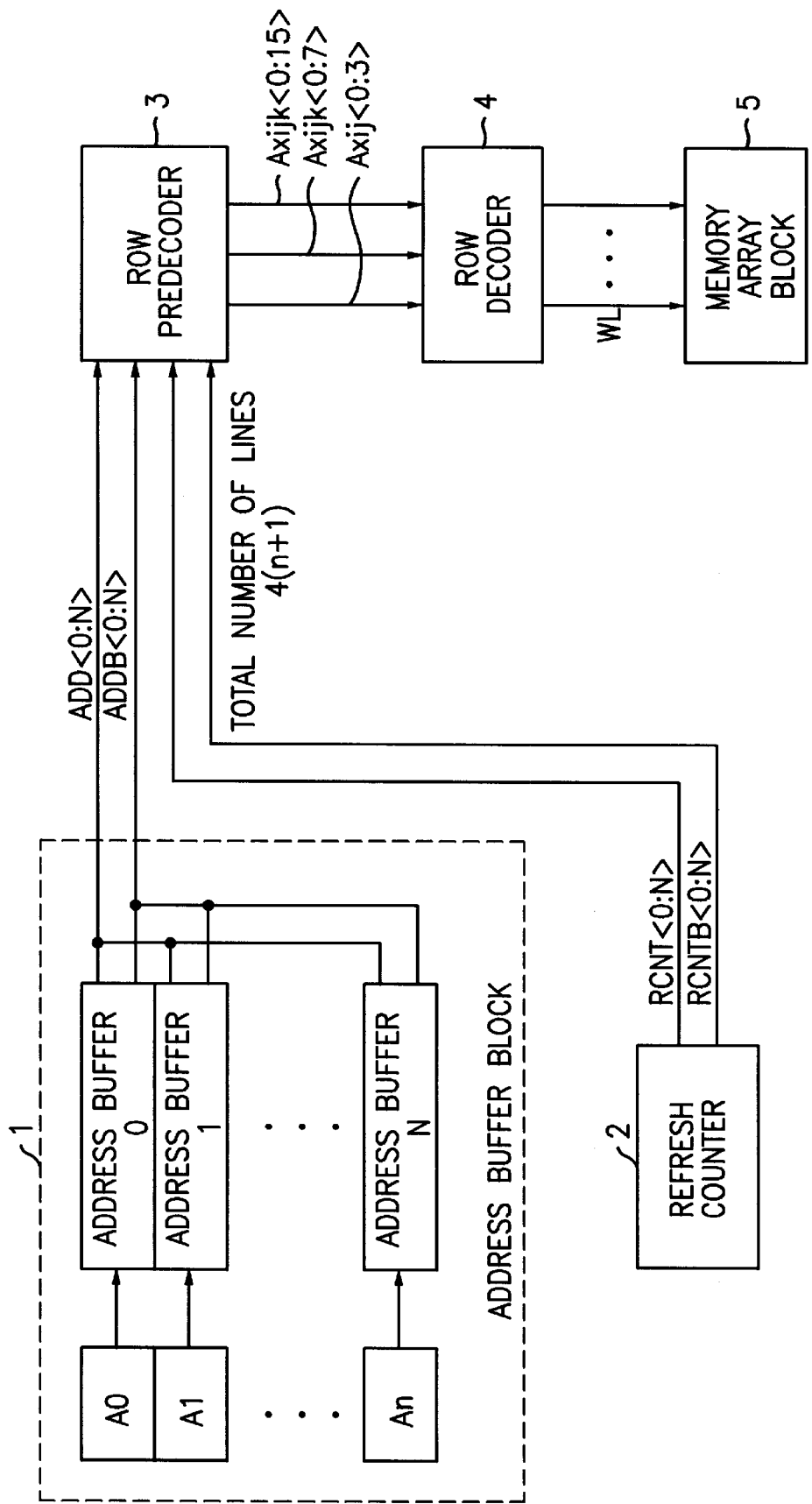
FIG. 1 is a schematic diagram illustrating a conventional memory device having row address bus lines.
Figure 3:
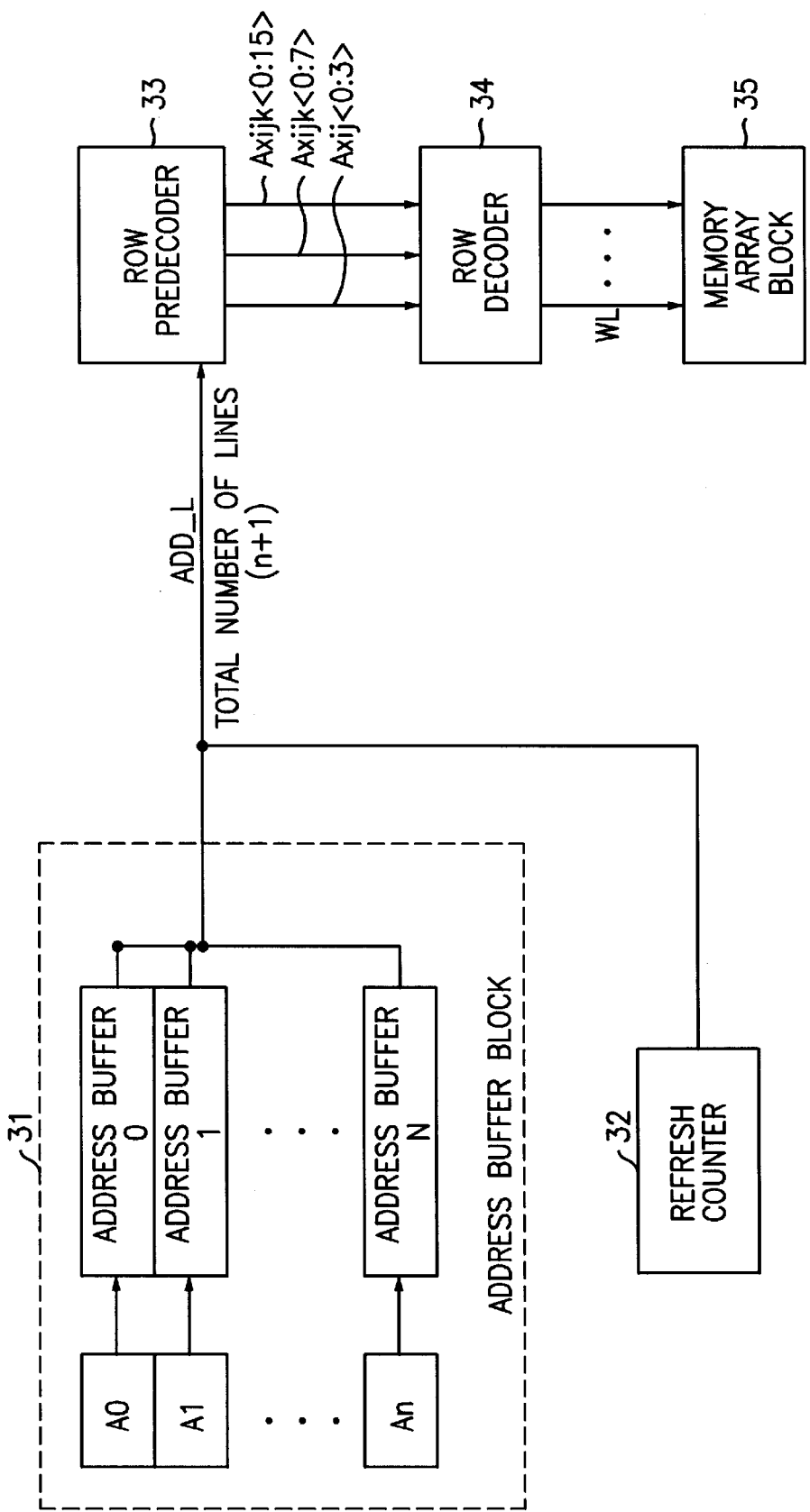
FIG. 3 is a schematic diagram illustrating a memory device according to the present invention.

Referring to FIG. 3, a predecoding method according to the present invention has n+1 lines. That is, each address buffer in an address buffer block 31 has only one bus line and a refresh counter 32 also has only one bus line. All bus lines are connected to a common bus line and all address signals are input into a row predecoder 33 through the common bus line. Output signals from the row predecoder 33 are input into a row decoder 34 to select a specific word line in a memory array block 35. Being different from the memory device in FIG. 1, since the address buffers are connected to the row predecoder 33 through only one common bus line, the number of address buffer lines (including a bus line for refresh) to select a specific word line is reduced up to n+1 for address signals A0 to An.

Figure 4:
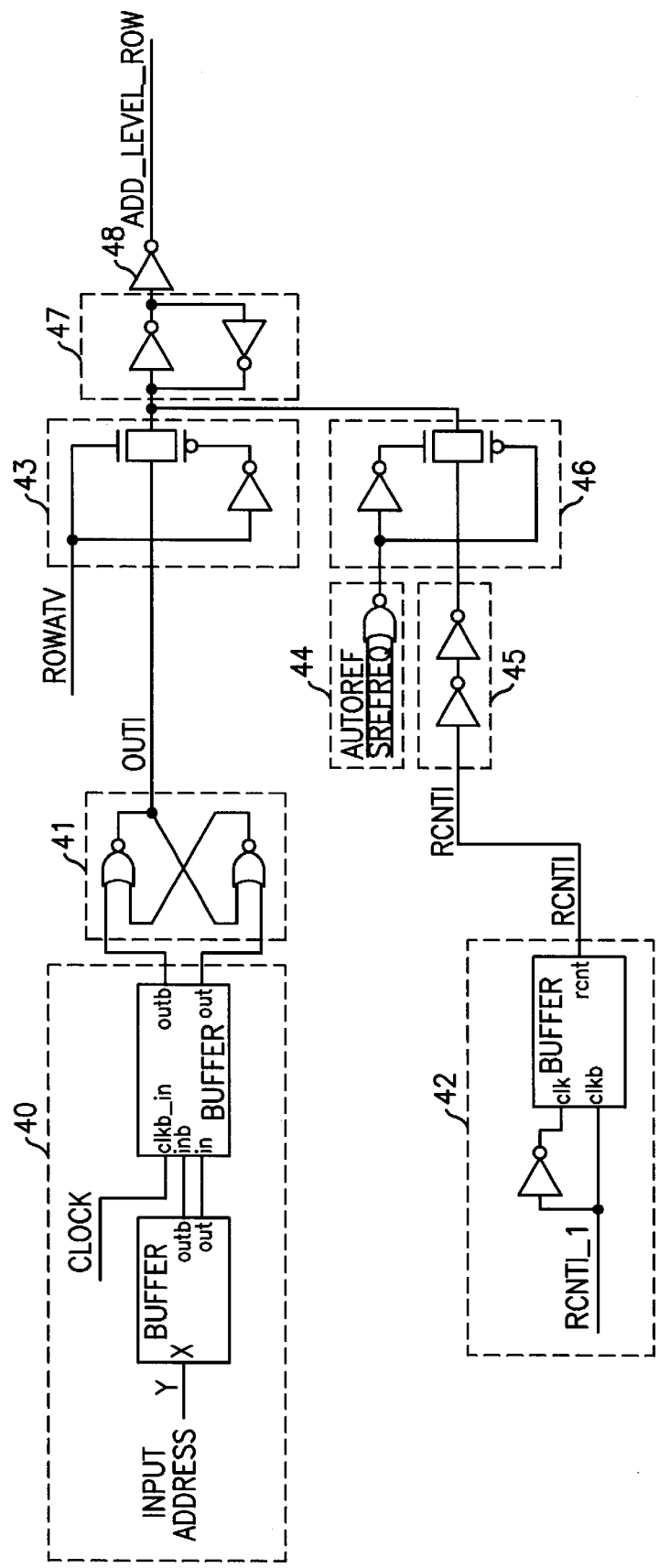
FIG. 4 is a circuit diagram illustrating an address buffer and a refresh counter in FIG. 3.

FIG. 4 is a circuit diagram illustrating the address buffer and the refresh counter in FIG. 3. Address signals are input into a buffering unit 40 and the buffered address signals are latched in a first latch circuit 41. A refresh counting address buffer unit 42 generates address signals to refresh each cell in the memory array block 35. Since the refresh and read/write operations are carried out separately, the address signals are selectively output to the row predecoder 33 through the common bus line. In other words, a row active signal ROWATV, which undergoes a low-to-high logic transition via an inverter, is enabled when external address signals are input from an external circuit. Accordingly, the row active signal ROWATV turns on a switch 43 and then outputs the address latched in the first latch circuit 41 to its output terminal.

Typically, the refresh in DRAMs is divided into an automatic refresh and a self refresh. Accordingly, a NOR gate is used in order that cells are refreshed whenever a request from them is issued. That is, if a first refresh enable signal AUTOREF notifying the start of the auto refresh or a second refresh enable signal SREFREQ notifying that the start of the self refresh undergoes a low-to-high logic transition, these refresh enable signals input into a NOR gate 44 turn on a switch 46 in order that the address signals stored in the refresh counting address buffer unit 42 are transferred to the common bus line. As a result, the row active signal ROWATV selectively outputs the external address signals and the first and second refresh enable signals AUTOREF and SREFREQ selectively output the internal address signals for refresh.

On the other hand, a second latch circuit 47 for stabilizing the output signal is formed at an output stage couple to the predecoder. Comparing with the number of bus lines in FIG. 1, the number of bus lines according to the present invention decreases up to 25% thereof with the high integration.

$$(n+1)(\text{present invention})/4(n+1)(\text{prior art})=\frac{1}{4}=25\%$$

n: the number of lines connected buffers

Furthermore, if one common bus line is used as described in the present invention, the number of control signals of the predecoder may be reduced and then the number of transistors receiving the control signals may be reduced.

Figure 5:
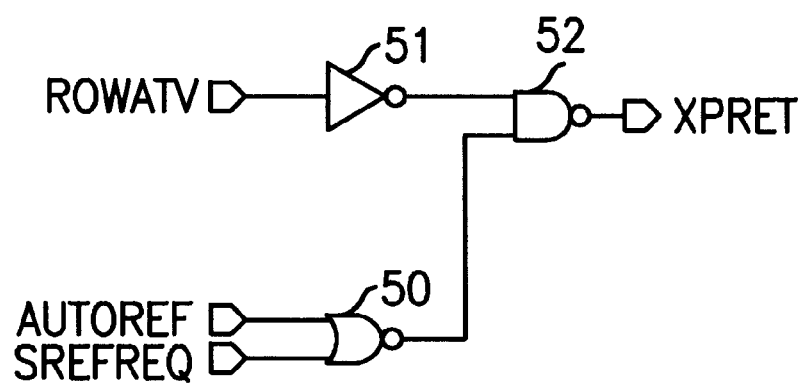
FIG. 5 is a circuit diagram illustrating a catch signal generator, which generates catch signals input into the row predecoder in FIG. 4.

Referring to FIG. 5, a catch signal generator generates a row predecoder catch signal XPRET by combining three control signals, the row active signal ROWATV and the first and second refresh enable signals AUTOREF and SREFREQ. The catch signal generator includes a NOR gate 50 logically NORing the first and second refresh enable signals AUTOREF and SREFREQ, an inverter 51 inverting the row active signal ROWATV, a NAND gate 52 logically NANDing outputs from the inverter 51 and the NOR gate 50. Of course, it is possible to create other row predecoder catch signals having other delay time, by providing additional inverters 70 to 73 and NAND gate 75. Since these kinds of row predecoder catch signals are beyond of the present invention, the detailed description will be omitted.

Referring again to FIG. 2, the conventional predecoder is in need of an external address catch signal EXT_AXT and an internal address catch signal INT_AXT. Since the conventional predecoder also requires the address bus lines and the address bus bar lines, eight lines are required per predecoder block and also one transistor is required for each line.

Figure 6:
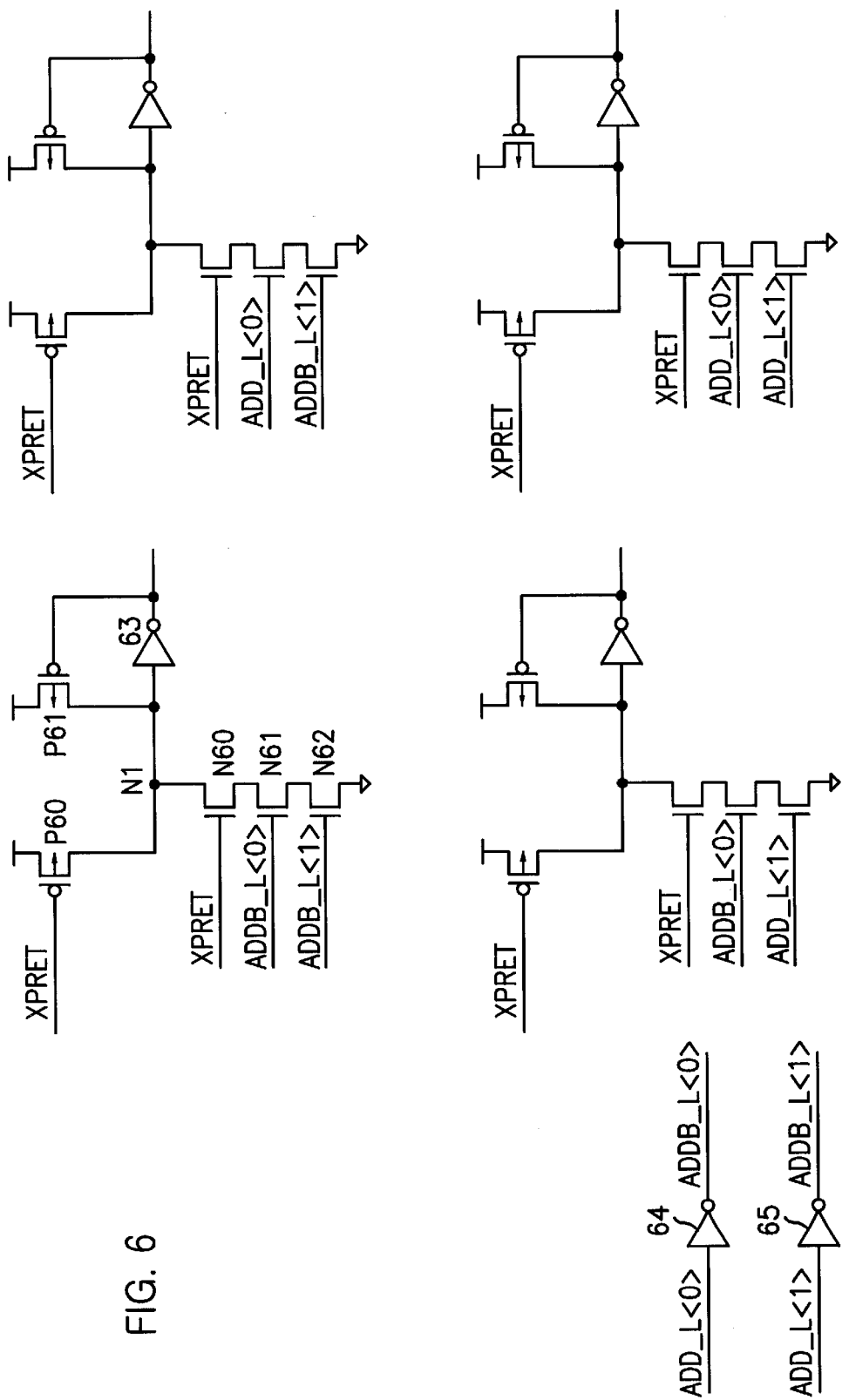
FIG. 6 is a circuit diagram illustrating a row predecoder according to the present invention.

On the other hand, as shown in FIG. 4, if the external address and refresh counting address signals are input through one common bus line, the functions carried out in NMOS transistors N2, N4 and N6 in FIG. 2 may be carried out in NMOS transistor N60, N61 and N62 in FIG. 6 with the reduction of the number of transistors. Further, since the external address and the refresh counting catch signals are input through one common bus line, the number of lines may be reduced.

As shown in FIG. 6, a row predecoder block having the reduced bus lines according to the present invention receives only four signals. That is, a PMOS transistor P60 providing power supply in response to a row predecoder catch signal XPRET is coupled to node N1 and three NMOS transistors N60 to N62, which are in series coupled to each other, are formed between node N1 and a ground voltage level in order to receive the row predecoder catch signal XPRET, address signals and their inverted address signals. The inverted address signals are obtained by inverters 64 and 65. Further, a precharge transistor P61 and an inverter 63 are formed so as to stabilize the output of the row predecoder.

As apparent from the above description, the present invention may increase the integration of the semiconductor devices by reducing the number of bus lines and transistors.

It will be apparent to those skilled in the art that various modifications and variations can be made in the other decoders, for example, column decoder, for the integrated circuits and the semiconductor memory devices of the present invention without departing from the sprit or scope of the present invention. Thus, it is intended that the present invention covers the modifications and variations within the scope of appended claims and their equivalents.

What is claimed is:

1. A memory device comprising:
    a common data bus line;
    a plurality of address buffers coupled to the common data bus line for buffering external address signals;
    a refresh counter coupled to the common data bus line, including a buffer for providing refresh address signals;
    a first control means for selectively transferring the external address signals buffered in the address buffers to the common data bus line; and
    a second control means for selectively transferring the refresh address signals from the refresh counter to the common data bus line, wherein the second control means transfers outputs buffered in the refresh counter to the common data bus line in response to a second control signal which is enabled when a refresh is carried out and wherein the second control signal is an auto refresh enable signal, which is issued when an auto refresh is carried out, or a self refresh enable signal, which is issued when a self refresh is carried out.

2. The memory device in accordance with claim 1, wherein the first control means transfers the external address signals buffered in the address buffers to the common data bus line in response to a first control signal which is enabled when the external address signals are input into the address buffers.

3. The memory device in accordance with claim 1, wherein the memory device receives n+1 address signals and wherein the common data bus line is coupled to the address buffers through n+1 lines.

4. The memory device in accordance with claim 2, wherein each of the address buffers includes:
    a buffering means for buffering the external address signals;
    a latch circuit for storing the external address signals from the buffering means; and
    a switching means for transferring the external address signals latched in the latch circuit to the common data bus line when the first control signal is enabled.

5. The memory device in accordance with claim 2, wherein the refresh counter includes:
    a refresh buffer means for buffering the refresh address signals;

a logic circuit for NORing the auto refresh enable signal and the self refresh enable signal; and a switching means for transferring the refresh address signals buffered in the refresh buffer means to the common data bus line in response to an output from the logic circuit.

6. A memory device comprising:

a common data bus line;

a plurality of address buffers and a plurality of refresh counting buffer, wherein the address buffers receive external address signals and the refresh counting buffers receive refresh address signals and wherein the address buffers and the refresh counting buffers are coupled to the common data bus line;

a first control means for selectively transferring address signals buffered in the address buffers to the common data bus line;

a second control means for selectively transferring the refresh address signals buffered in the refresh counting buffer to the common data bus line; and a predecoder coupled to the common data bus line, wherein the predecoder includes four transistors receiving a predecoder catch signal and external or refresh address signals.

7. The memory device in accordance with claim 6, wherein the predecoder catch signal is produced by a logic circuit receiving an active signal enabled when the external address signals are input and an auto or self refresh signal enabled when a refresh are carried out.

8. The memory device in accordance with claim 6, wherein the predecoder further includes an inverter formed at an output terminal thereof and a PMOS transistor for precharging the output terminal in response to an output of the inverter.

* * * * *